(12) United States Patent  
Akimoto et al.

(10) Patent No.: US 8,054,397 B2  
(45) Date of Patent: Nov. 8, 2011

(54) DISPLAY DEVICE AND MANUFACTURING METHOD THEREOF

(75) Inventors: Kengo Akimoto, Kanagawa (JP); Noriko Miyagi, Shiga (JP); Shingo Eguchi, Tochigi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 456 days.

(21) Appl. No.: 11/436,131

(22) Filed: May 18, 2006

(65) Prior Publication Data

US 2006/0214168 A1 Sep. 28, 2006

Related U.S. Application Data

(62) Division of application No. 10/802,040, filed on Mar. 17, 2004, now Pat. No. 7,057,208.

(30) Foreign Application Priority Data

Mar. 25, 2003 (JP) ................................. 2003-083120

(51) Int. Cl.  
*G02F 1/136* (2006.01)

(52) U.S. Cl. ............... 349/46; 257/59; 438/28; 349/42; 349/43; 349/44; 349/45; 349/47; 349/48

(58) Field of Classification Search ................ 257/59; 438/29; 349/42, 43, 44, 45, 46, 47, 48  
See application file for complete search history.

(56) References Cited

U.S. PATENT DOCUMENTS

| | | | |
|---|---|---|---|
| 5,640,067 A | 6/1997 | Yamauchi et al. | |
| 6,222,314 B1 | 4/2001 | Arai et al. | |
| 6,310,674 B1 * | 10/2001 | Suzuki et al. | 349/139 |
| 6,416,888 B1 | 7/2002 | Kawamura et al. | |
| 6,433,842 B1 * | 8/2002 | Kaneko et al. | 349/43 |
| 6,448,580 B1 | 9/2002 | Arai et al. | |
| 6,492,778 B1 | 12/2002 | Segawa | |
| 6,541,918 B1 | 4/2003 | Yudasaka | |
| 6,580,212 B2 | 6/2003 | Friend | |
| 6,614,174 B1 | 9/2003 | Urabe et al. | |
| 6,680,577 B1 | 1/2004 | Inukai et al. | |
| 6,825,820 B2 | 11/2004 | Yamazaki et al. | |
| 7,129,965 B2 * | 10/2006 | Iwamatsu et al. | 347/237 |
| 7,547,562 B2 | 6/2009 | Ogino | |
| 7,639,248 B2 | 12/2009 | Yamazaki et al. | |
| 2001/0026126 A1 * | 10/2001 | Nakaya et al. | 313/506 |

(Continued)

FOREIGN PATENT DOCUMENTS

EP 0 782 039 A2 7/1997

(Continued)

*Primary Examiner* — David Vu  
*Assistant Examiner* — Brandon Fox  
(74) *Attorney, Agent, or Firm* — Nixon Peabody, LLP; Jeffrey L. Costellia

(57) ABSTRACT

It is an object of the present invention to provide a display device that has a structure of an electrode where a residue of a transparent conductive film is not generated when a weak acid solution is used in etching, which is particularly appropriate for an electrode of a light-emitting element.

A display device according to the present invention has an electrode that has a laminated structure of laminated transparent conductive films, and the electrode has a first transparent conductive film as the bottom layer, where no residue is generated when a weak acid solution is used in etching, and a second transparent conductive film as the top layer, which has a work function of 5.0 eV or more.

48 Claims, 10 Drawing Sheets

U.S. PATENT DOCUMENTS

| | | |
|---|---|---|
| 2002/0110940 A1* | 8/2002 | Yamagata et al. .............. 438/22 |
| 2002/0153831 A1 | 10/2002 | Sakakura et al. |
| 2003/0067266 A1* | 4/2003 | Kim et al. .................... 313/504 |
| 2003/0122799 A1* | 7/2003 | Yu ................................ 345/173 |
| 2010/0073269 A1 | 3/2010 | Yamazaki et al. |

FOREIGN PATENT DOCUMENTS

| | | |
|---|---|---|
| JP | 64-010507 | 1/1989 |
| JP | 09-185062 | 7/1997 |
| JP | 2000-108244 | 4/2000 |
| JP | 2001-319777 | 11/2001 |
| JP | 2001-331124 | 11/2001 |
| JP | 3257913 | 12/2001 |
| JP | 2002-124680 | 4/2002 |
| JP | 2002-151276 | 5/2002 |
| JP | 2003-068457 | 3/2003 |
| JP | 2003-115391 | 4/2003 |
| WO | WO03059628 * | 7/2003 |
| WO | WO 03059628 A1 * | 7/2003 |

* cited by examiner

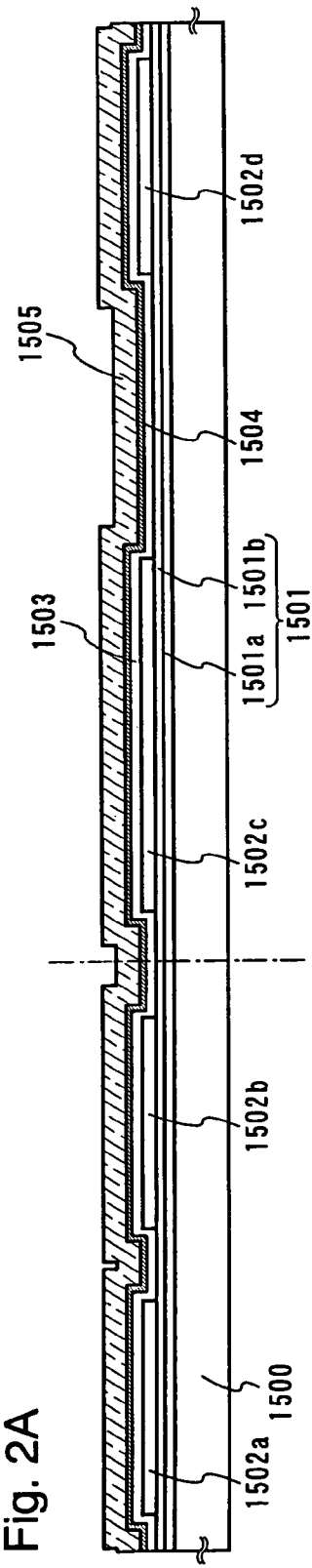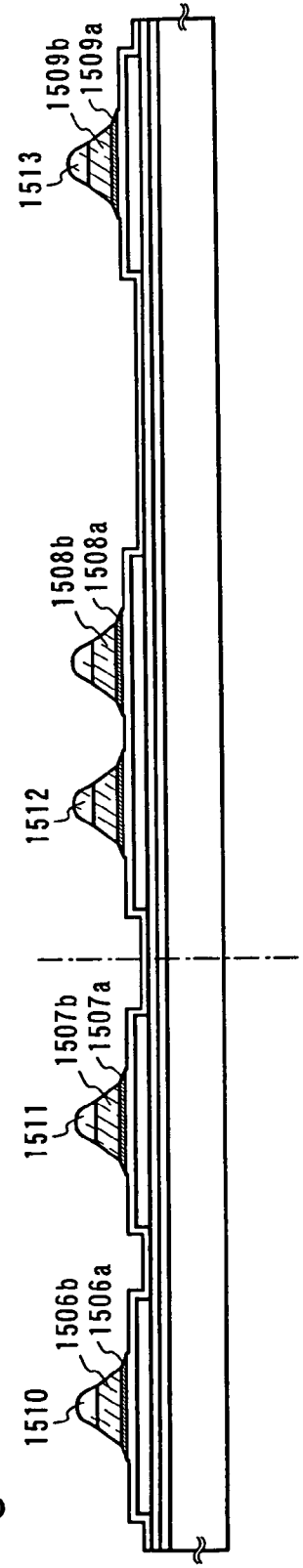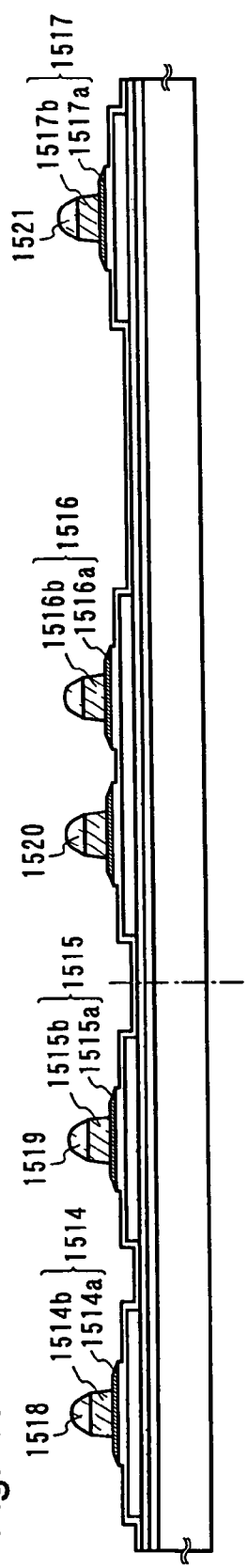

DISPLAY DEVICE AND MANUFACTURING METHOD THEREOF

BACKGROUND OF THE INVENTION

1. Field of the Invention

The present invention relates to a display device, in particular, to a structure of an electrode of an active matrix display device that has a light-emitting element.

2. Description of the Related Art

In display devices such as an EL (Electro-Luminescence) display device and a liquid crystal display device, a transparent conductive film such as an indium tin oxide (ITO) film is used as an electrode of a pixel portion.

As a method for processing an ITO film into a desired shape of an electrode, a method of performing wet etching with a resist film as a mask is mainly used.

In general, concerning wet etching of an ITO film, it is known that an amorphous ITO film is subjected to wet etching more easily than a crystalline ITO film, and a structure of an electrode of a liquid crystal display device has been proposed in consideration of the etching characteristic (refer to Patent Document 1, for example).

[Patent Document 1] Japanese Patent Gazette No. 3257913 (page 2 and FIG. 1)

The structure of the electrode of the liquid crystal display device has an upper layer of a crystalline ITO film and a lower film of an amorphous ITO film for improving an etching characteristic.

However, a slight amount of crystalline component during deposition is mixed, for example, in an amorphous ITO film formed with sputtering, and there is a problem of the crystalline component remaining as a residue after wet etching. This tendency is noticeable particularly in the case of using a weak acid solution such as oxalic acid as an etching solution.

However, a low acid-resistant conductive film such as aluminum is used to form a wiring in a display device such as an EL display device or a liquid crystal display device. Therefore, it is preferable to use a weak acid solution for etching an ITO film in order to prevent the conductive film from reacting with an etching solution during etching the ITO film. In addition, also in terms of easiness of using a weak acid solution, it is preferable to use a weak acid solution than a strong acid solution. Consequently, it is required to develop a structure of an electrode or an etching method so that no residue is remaining when a weak acid solution is used for etching.

SUMMARY OF THE INVENTION

In consideration of the problem as described above, it is an object of the present invention to provide a display device that has a structure of an electrode where a residue of a transparent conductive film is not generated when a weak acid solution is used in etching, which is particularly appropriate for an electrode of a light-emitting element.

A display device according to the present invention has an electrode that has a laminated structure of laminated transparent conductive films, and the electrode has a first transparent conductive film as the bottom layer, where no residue is generated when a weak acid solution is used in etching, and a second transparent conductive film as the top layer, which has a work function of 5.0 eV or more.

When the electrode has the structure as above, a residue generated during etching the second transparent conductive film can be subjected to lift-off during etching the first transparent conductive film to remove the residue. Therefore, even in the case of using a weak acid solution, etching can be performed without generating a residue.

As the first transparent conductive film, indium tin oxide (ITO) containing one or both of silicon oxide ($SiO_2$) and silicon (Si), zinc oxide (ZnO), and zinc oxide containing gallium (Ga) (ZnO:Ga) can be used, for example.

In particular, indium tin oxide (ITO) containing one or both of silicon oxide ($SiO_2$) and silicon (Si) is completely amorphous without a crystalline component mixed in during deposition, and no residue is generated when a weak acid solution such as oxalic acid is used for etching the indium tin oxide, so that etching can be performed easily. In addition, the indium tin oxide is not crystallized at least by heat treatment of 250° C. or less, and remains amorphous. Furthermore, since the indium tin oxide has few projections generate to be highly flat and smooth, it is also an advantage that a polishing process after forming the second transparent conductive film becomes easier. The indium tin oxide (ITO) containing one or both of silicon oxide ($SiO_2$) and silicon (Si) can be formed by sputtering with indium tin oxide containing silicon oxide ($SiO_2$) from 1 to 10 wt % as a target.

Besides, as the second transparent conductive film, a film that has a work function of 5.0 eV or more such as crystalline indium tin oxide (ITO) or crystalline tin oxide ($SnO_2$) can be used.

In order to form crystalline indium tin oxide (ITO), an amorphous indium tin oxide (ITO) is formed, a weak acid solution is used to etch the amorphous indium tin oxide into a desired shape, and heat treatment is performed to crystallize the etched crystalline indium tin oxide. After the crystallization, the work function can be made higher by surface treatment that uses oxygen plasma or alkali solution to serve as an electrode that is particularly appropriate for an anode of a light-emitting element.

Additionally, according to the present invention, a terminal portion of a flexible printed circuit (FPC) has a laminated structure of a conductive film that has a low resistance, a first transparent conductive film where no residue is generated when a weak acid solution is used in etching, and a second transparent conductive film that has a work function of 5.0 eV or more.

As the conductive film that has a low resistance of a specific resistance of 3 µΩ or less, metal such as aluminum (Al) and copper (Cu) can be used. By covering the conductive film with the first and second transparent conductive films, oxidation of the conductive film can be prevented and the specific resistance can be prevented from increasing.

Besides, another display device according to the present invention has an electrode that has a laminated structure of laminated transparent conductive films, the electrode is provided on a silicon nitride film formed by sputtering, and the electrode has a first transparent conductive film as the bottom layer, where no residue is generated when a weak acid solution is used in etching, and a second transparent conductive film as the top layer, which has a work function of 5.0 eV or more.

A residue caused by etching a film of amorphous indium tin oxide is likely to be generated particularly on a silicon nitride film formed by sputtering. However, in a display device that has a light-emitting element, it is preferable to provide a silicon nitride film formed by sputtering below the light-emitting element in order to prevent an impurity from being mixed into a TFT from the light-emitting element. In addition, in the case of using a flexible organic resin film such as acrylic or polyimide as an interlayer insulating film, polishing becomes easier in a polishing process after forming the second transparent conductive film when a structure that has a rigid inorganic film such as a silicon nitride film below the first transparent conductive film is employed. Accordingly, the present invention is effective also in the case of forming an electrode including a transparent conductive film on a silicon nitride film formed by sputtering.

In the present invention, in the case of using crystalline indium tin oxide as the second transparent conductive film, it is an advantage that metals included in a solution for polishing such as iron (Fe) and potassium (K) can be removed with the use of a strong acid solution when chemical mechanical polishing (CMP) is used to perform a polishing process for removing a projection at a surface of the second transparent conductive film. In this case, it is preferable to have a structure in which conductive films with no resistance against strong acid are all covered with the second transparent conductive film.

BRIEF DESCRIPTION OF THE DRAWINGS

In the accompanying drawings:

FIGS. 2A to 2C are diagrams for describing a method of manufacturing a display device according to the present invention;

DETAILED DESCRIPTION OF THE INVENTION

Embodiment Mode

Hereinafter, an embodiment mode and embodiments of the present invention will be described with reference to the drawings. However, the present invention can be implemented in various different embodiments, and it is to be understood that various changes and modifications will be apparent to those skilled in the art. Therefore, unless otherwise such changes and modifications depart from the scope of the present invention, they should be construed as being included therein.

The embodiment mode of the present invention will be described with reference to FIG. 1.

Figure 1:
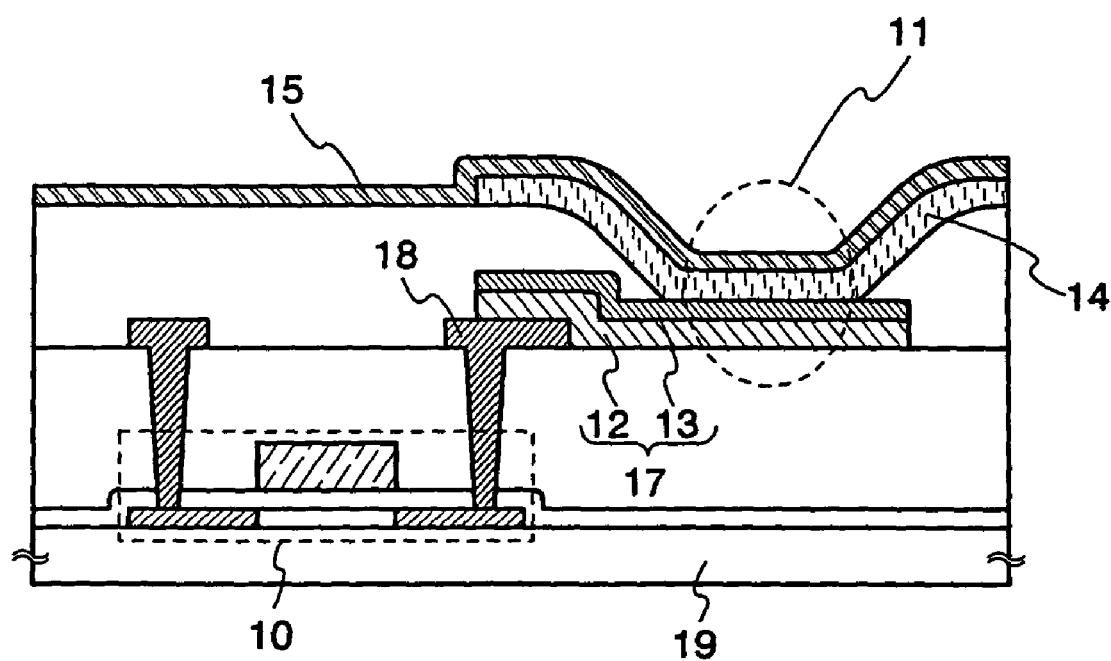
FIG. 1 is a diagram for describing the present invention.

In FIG. 1, a light-emitting element 11 and a TFT for driving the light-emitting element 10 are formed on a substrate 19. The light-emitting element 11 has a structure in which an electrode 17 that functions as an anode, a light-emitting layer 14, and an electrode 15 that functions as a cathode are in this order laminated. The TFT for driving the light-emitting element 10 is connected to the light-emitting element 11 through a wiring 18.

The electrode 17 that functions as the anode of the light-emitting element has a laminated structure of a first transparent conductive film 12 and a second transparent conductive film 13 that has thinner film thickness than the first transparent conductive film 12.

The first transparent conductive film 12 includes no crystalline component, and therefore it is easy to perform etching with a weak acid solution such as oxalic acid $((COOH)_2)$. In addition, a projection is unlikely to be generated, and therefore the first transparent conductive film 12 is highly flat and smooth. On the other hand, the second transparent conductive film 13 is formed of a material that has a high work function.

As the first transparent conductive film 12, indium tin oxide (ITO) containing one or both of silicon oxide ($SiO_2$) and silicon (Si), zinc oxide (ZnO), and zinc oxide containing gallium (Ga) (ZnO:Ga) can be used, for example. As the second transparent conductive film 13, a material that has a high work function, for example, a film that has a work function of 5.0 eV or more such as indium tin oxide (ITO) or crystalline tin oxide ($SnO_2$) can be used.

An amorphous film including ITO or $SnO_2$ can be etched with the use of a weak acid solution. However, there is a case where a crystalline portion slightly formed in an amorphous ITO remains as a residue caused by etching. By using, as the first transparent conductive film 12, a film where a residue of a transparent conductive film is not generated when a weak acid solution is used in etching, a residue generated during etching the second transparent conductive film 13 with the use of a weak acid solution can be subjected to lift-off to remove the residue. The electrode 17 is etched with the use of the weak acid solution in order to prevent a wiring (usually formed of a low acid-resistant material such as aluminum) in contact with an etching solution from reacting with the etching solution.

In this way, the generation of residue during etching the second transparent conductive film can be suppressed.

When a transparent conductive film is formed, a projection of up to several hundreds µm is formed at a surface of the transparent conductive film. Usually, the surface is polished to remove the projection since a light-emitting element short out due to the projection. A transparent conductive film formed to include one material selected from indium tin oxide (ITO) containing one or both of silicon oxide ($SiO_2$) and silicon (Si), ZnO, and ZnO containing Ga has less convexoconcave due to a projection, and therefore is highly flat and smooth. By using the film that is highly flat and smooth for the first transparent conductive film 12, the number of the generated projections is reduced, and a polishing process becomes easier In the case of using one of the materials that can be used for the first transparent conductive film 12, that is, one of indium tin oxide (ITO) containing one or both of silicon oxide ($SiO_2$) and silicon (Si), ZnO, and ZnO containing Ga, the first transparent conductive film 12 can be easily etched without generating a residue when a weak acid is used in the etching.

Besides, a light-emitting element can have a luminance efficiency enhanced by forming the second transparent conductive film 13 to include a material that has a high work function such as ITO or $SiO_2$. As the material such as ITO or $SiO_2$ is deposited to have a thicker film thickness, the number of projections is increased, and the convexoconcave has a tendency to get bigger. Consequently, the material is deposited to have a film thickness of approximately 30 nm or less, and thereby the generation of projection is suppressed. However, in the case of a single layer that has a film thickness of approximately 30 nm or less, since it is difficult to cover a step due to a wiring, the first transparent conductive film 12 is formed below the second transparent conductive film 13 to have a film thickness from 80 to 120 nm in the present embodiment mode. In other words, the first transparent conductive film 12 also has a function of prevent disconnection of the second transparent conductive film 13.

In the present embodiment mode, the second transparent conductive film 13 is subjected to surface treatment after heat treatment for crystallization. Here, as the heat treatment, a method such as exposing to oxygen plasma can be used.

As described above, by applying the present invention, it is possible to suppress a generation of residue due to etching and make smoothing easier. In addition, a luminous efficiency can be enhanced.

EMBODIMENTS

Embodiment 1

In the present embodiment, a method of manufacturing a light-emitting device according to the present invention is used to describe a method of manufacturing an active matrix display device that has a thin film transistor and a light-emitting element with reference to FIGS. 2A to 6B.

On a substrate 1500, a laminate of a base insulating film 1501a formed to have a film thickness from 50 to 100 nm and a base insulating film 1501b formed to have a film thickness from 50 to 100 nm is formed (FIG. 2A). The base insulating film 1501 (1501a and 1501b) is formed in order to prevent impurity diffusion from the substrate 1500 to a semiconductor layer. In the present embodiment, low alkali glass is used, and a silicon nitride film with a film thickness of 100 nm and a silicon oxide film with a film thickness of 100 nm are respectively formed by plasma CVD as the base insulating film 1501a and the base insulating film 1501b. Although the base insulating film has the two layers laminated in the present embodiment, a single layer or a laminate of three layers or more may be employed as long as impurity diffusion can be prevented. In a manufacturing process of a TFT, a substrate with translucency such as glass or quartz is used. However, another substrate may be used in addition to the substrate with translucency as long as the substrate can resist a processing temperature in each process since a bottom emission display device is manufactured in the present embodiment.

Next, semiconductor films 1502a to 1502d are formed on the base insulating film 1501 (FIG. 2A). In order to form the semiconductor films 1502a to 1502d, a crystalline silicon film obtained by a known crystallization method (such as solid phase growth, laser crystallization, or solid phase growth using nickel as a catalytic metal element) is processed into a desired shape after a known method (such as CVD or sputtering) is used to form an amorphous semiconductor film.

In the present embodiment, an amorphous silicon film that has a film thickness of 55 nm is formed by plasma CVD as the amorphous semiconductor film. Instead of the amorphous silicon film, another amorphous semiconductor film such as amorphous silicon germanium ($Si_xGe_{1-x}$(x=0.0001 to 0.02)) may be used. Alternatively, a crystalline semiconductor film may be deposited instead of crystallizing an amorphous semiconductor film to obtain a crystalline semiconductor film. The film thickness is not limited to 55 nm, but may also be changed appropriately.

In addition, solid phase growth using nickel as a catalytic metal element (heat treatment at 550° C. for 4 hours) is used to crystallize the amorphous silicon film. In order to further improve crystallinity, excimer laser treatment is conducted, and then the crystalline silicon film is obtained.

Next, ozone water is used to form a thin oxide film on a surface of the crystalline silicon film, which has a film thickness from 1 to 2 nm, and an amorphous silicon film is formed thereon by sputtering to have a film thickness of 100 nm. Then, heat treatment with a furnace at 550° C. for 4 hours is conducted to move the catalytic metal element included in the crystalline silicon film to the amorphous silicon film (gettering). After the gettering, TMAH solution is used to remove the amorphous silicon film no longer required (the amorphous silicon film may be a crystalline silicon film after the gettering due to the action of the catalytic metal element), and hydrofluoric acid solution is further used to remove the thin oxide film.

Then, the crystalline silicon film is processed into a desired shape by patterning with photolithography and etching to form the semiconductor films 1502a to 1502d.

Before or after forming the semiconductor films 1502a to 1502d, doping for controlling threshold voltage of a TFT (channel doping) may be performed. As an impurity for the doping, boron or phosphorus may be used.

In the case of using laser crystallization to form the crystalline semiconductor film, pulsed laser or continuous-wave laser that uses excimer (XeCl), YAG, or $YVO_4$ as a laser medium can be used. In the case of using excimer laser, the pulse oscillation frequency is set at approximately 300 Hz and the laser energy density is set from 100 to 400 mJ/cm². In the case of using YAG laser, the second harmonic is used, the pulse oscillation frequency is set from 30 to 300 Hz, and the laser energy density is set from 300 to 600 mJ/cm². It is also possible to condense an emitted laser beam into a linear laser beam in a linear shape that has a width from 100 to 1000 μm and irradiate the linear laser beam to the whole of the substrate with an overlap ratio of 50 to 90%.

Next, a gate insulating film 1503 is formed to cover the semiconductor films 1502a to 1502d (FIG. 2A). In the present embodiment, plasma CVD is used for deposition to form a silicon oxide film with a film thickness of 110 nm. In addition to the silicon oxide film, another insulating film may be used to form the gate insulating film 1503. The film thickness is not limited to 110 nm, but may also be changed appropriately in consideration of a property such as a dielectric constant.

Next, a laminate of a conductive film 1504 and a conductive film 1505 is formed on the gate insulating film 1503 (FIG. 2A). In the present embodiment, tantalum nitride (TaN) is deposited by sputtering to have a film thickness of 30 nm for forming the conductive film 1504 and tungsten (W) is deposited by sputtering to have a film thickness of 370 nm for forming the conductive film 1505. As materials that are used for the conductive films 1504 and 1505, not only tantalum nitride and tungsten, but also an element selected from the group consisting of Ta, W, Ti, Mo, Al, Cu, Cr, and Nd, an alloy film or a compound material including the element, and a semiconductor film typified by a polycrystalline silicon film doped with an impurity element such as phosphorus may be used. As the conductive film 1504, a material that has a favorable adhesiveness to the gate insulating film is selected, and a material that has a low resistance about from 9 to 20 μΩcm is selected as the conductive film 1505.

Next, the conductive films 1504 and 1505 are processed into a desired shape by patterning and etching. First, resist masks 1510 to 1513 that respectively have slope sidewalls are formed (FIG. 2B). Then, the resist masks 1510 to 1513 are used as masks to etch the conductive film 1505 and subsequently etch the conductive film 1504. Depending on angles of the slope sidewalls (taper angles) of the resist masks 1510 to 1513, the conductive film 1505 is processed into conductive films 1506b, 1507b, 1508b, and 1509b that have a taper angle of about 26, and the conductive film 1504 is also processed into conductive films 1506a, 1507a, 1508a, and 1509a that have a taper angle from 15 to 45 (FIG. 2B).

Next, with resist masks 1518 to 1521 as masks, the conductive films 1506b, 1507b, 1508b, and 1509b are selectively etched, and hereby processed into conductive films 1514b, 1515b, 1516b, and 1517b that respectively have nearly vertical sidewalls (FIG. 2C). In this case, it is required to use anisotropic etching mainly for the vertical direction. As the resist masks 1518 to 1521, the resist mask 1510 to 1513 used for the foregoing etching to the conductive films 1504 and 1505 are continuously used as they are. The conductive films 1506a, 1507a, 1508a, and 1509a are not processed to remain as conductive films 1514a, 1515a, 1516a, and 1517a (FIG. 2C).

In this way, a gate electrode 1514 that has the conductive films 1514a and 1514b, a gate electrode 1515 that has the conductive films 1515a and 1515b, a gate electrode 1516 that has the conductive films 1516a and 1516b, and a gate electrode 1517 that has the conductive films 1517a and 1517b are formed (FIG. 2C).

Figure 3A:
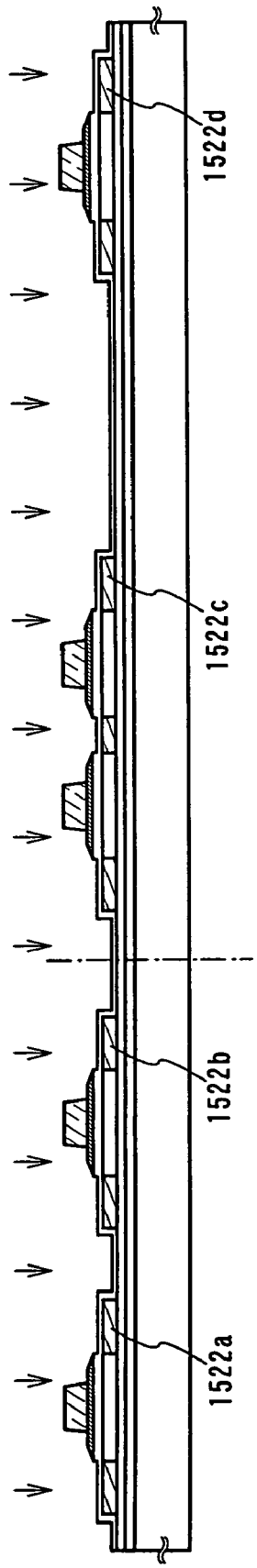
FIGS. 3A to 3C are diagrams for describing the method of manufacturing the display device according to the present invention.

Next, the gate electrodes 1514 to 1517 are used as masks to perform doping with a lower concentration of n-type impurity. In the present embodiment, the semiconductor films 1502a to 1502d are doped with phosphorus as the n-type impurity to have a lower concentration of $1 \times 10^{17}$ atoms/cm$^3$ to form lower concentration impurity regions 1522a to 1522d (FIG. 3A). The doping is thus performed at the lower concentration in order to form an LDD (Lightly Doped Drain) region for suppressing off-leakage current of a TFT, which varies with the impurity concentration of the LDD region. Therefore, the dose amount of the impurity is appropriately changed in order for off-leakage current to be a prescribed value or less. Although phosphorus is used as the n-type impurity in the present embodiment, there is no particular limitation, and another impurity may be used.

Figure 3B:
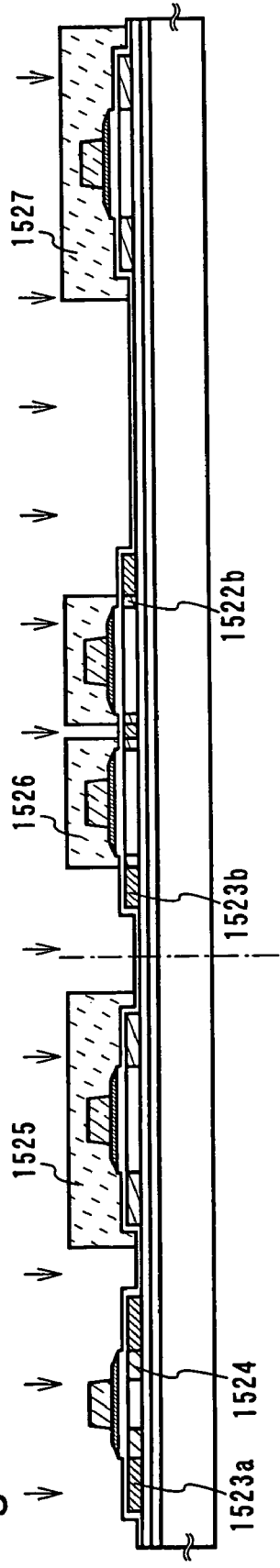

Next, resist masks 1525 to 1527 and the conductive film 1514b are used as masks to perform doping with an n-type impurity at a higher concentration (FIG. 3B). The resist mask 1525 is formed to cover the semiconductor film 1502b and the gate electrode 1515, the resist mask 1526 is formed to cover a portion of the semiconductor film 1502c (a portion that serves as an LDD region of a TFT) and the gate electrode 1516, and the resist mask 1527 is formed to cover the semiconductor film 1502d and the gate electrode 1517. In the present embodiment, a portion of the semiconductor film 1502a above which the conductive film 1514a is not formed and a portion of the semiconductor film 1502c above which the resist mask 1526 is not formed are doped with phosphorus to have a higher concentration of $1 \times 10^{20}$ atoms/cm$^3$. At the same time, another portion of the semiconductor film 1502a above which the conductive film 1514a is formed is doped with phosphorus to have a lower concentration of $1 \times 10^{18}$ atoms/cm$^3$. In consequence, a higher concentration impurity regions 1523a and 1523b including phosphorus at the higher concentration and a lower concentration impurity region 1524 including phosphorus at the lower concentration are formed (FIG. 3B) since the portion above which the conductive film 1514a is formed has a different blocking capability against the added impurity from the portion above which the conductive film 1514a is not formed. Although phosphorus is used as the n-type impurity in the present embodiment, there is no particular limitation, and another impurity may be used.

Figure 3C:
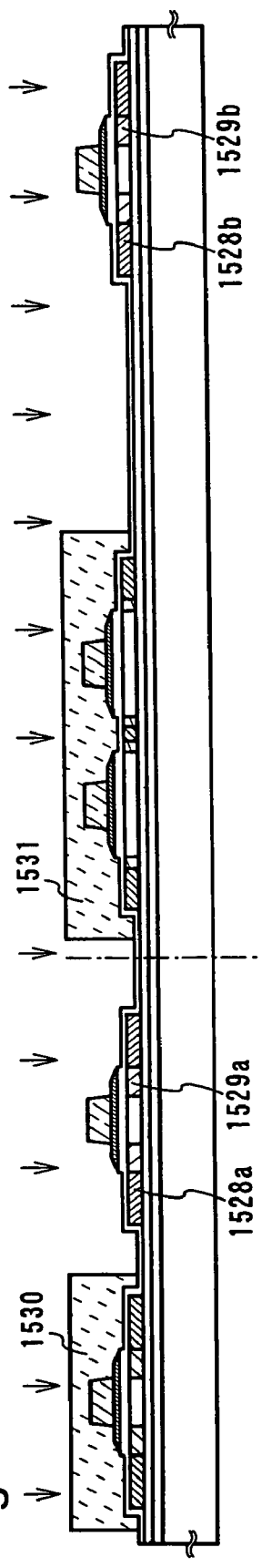

Next, resist masks 1530 and 1531 and the conductive films 1515b and 1517b are used as masks to perform doping with a p-type impurity at a higher concentration (FIG. 3C). The resist mask 1530 is formed to cover the semiconductor film 1502a and the gate electrode 1514 and the resist mask 1531 is formed to cover the semiconductor film 1502c and the gate electrode 1516. In the present embodiment, a portion of the semiconductor film 1502b above which the conductive film 1515a is not formed and a portion of the semiconductor film 1502d above which the conductive film 1517a is not formed are doped with boron to have a higher concentration of $1 \times 10^{20}$ atoms/cm$^3$, and thereby higher concentration impurity regions 1528a and 1529a are formed. At the same time, another portion of the semiconductor film 1502b above which the conductive film 1515a is formed and another portion of the semiconductor film 1502d above which the conductive film 1517a is formed are doped with boron to have a lower concentration of $1 \times 10^{19}$ atoms/cm$^3$, and thereby lower concentration impurity regions 1528b and 1529b are formed. Although boron is used as the p-type impurity in the present embodiment, there is no particular limitation, and another impurity may be used.

Figures 4A, 4B, 4C:
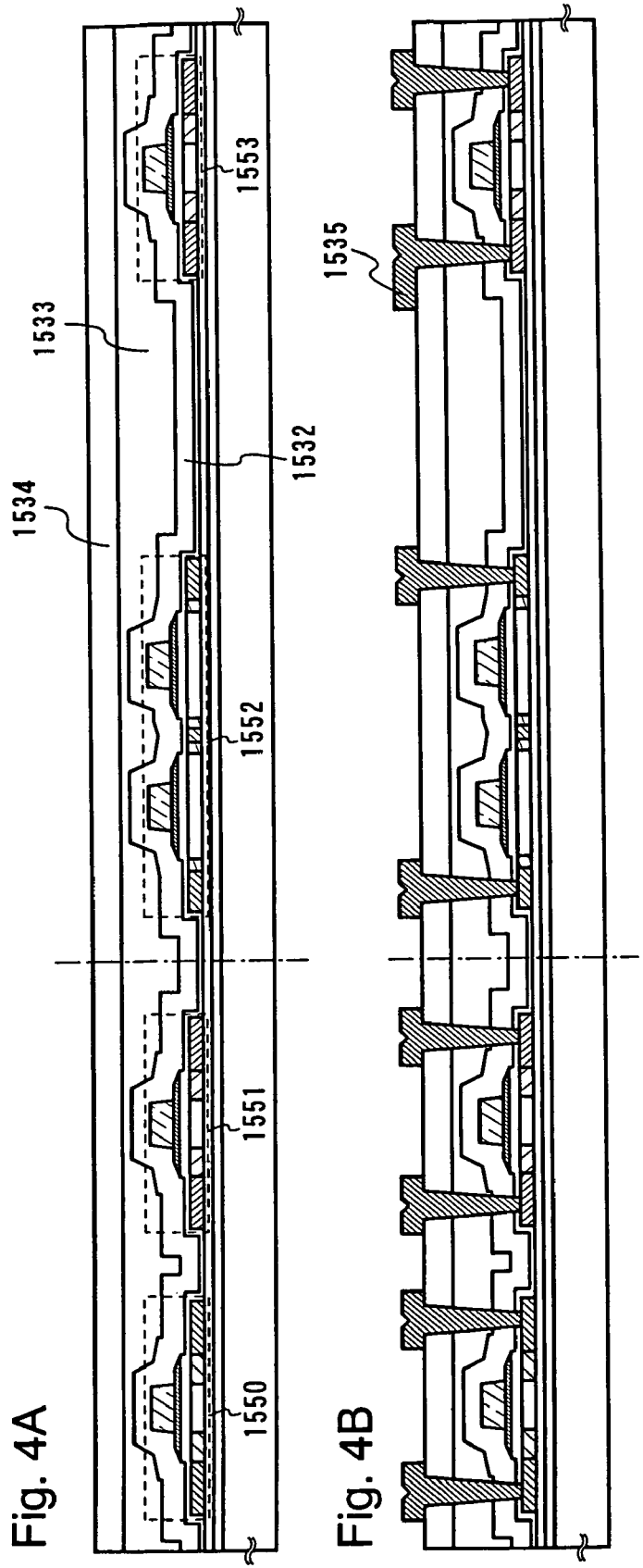
FIGS. 4A to 4C are diagrams for describing the method of manufacturing the display device according to the present invention.

In this way, TFTs 1550 to 1553 are manufactured (FIG. 4A). The TFTs 1550 and 1551 serve as TFTs for a driver circuit, the TFT 1552 serves as a switching TFT, and the TFT 1553 serves as a TFT for driving a light-emitting element.

Then, heat treatment is performed for activating the added impurities. In the present embodiment, heat treatment with a furnace at 550° C. for 4 hours is performed in a nitrogen atmosphere that has an oxygen concentration of 0.1 ppm or less in order to prevent the gate electrodes 1514 to 1517 from being oxidized. When an insulating film such as a silicon oxide film is formed on the TFTs 1550 to 1553 in order to prevent oxidation of the gate electrodes 1514 to 1517, the oxygen concentration may range no less than 0.1 ppm and no more than 1 ppm. Instead of the heat treatment with a furnace, another method such as activation with laser or RTA (Rapid Thermal Annealing) may be used.

Next, an interlayer insulating film 1532 is formed to cover the TFTs 1550 to 1553 (FIG. 4A). In the present embodiment, plasma CVD is used for deposition to form a silicon oxynitride film (SiNO) with a film thickness of 100 nm. In addition to the silicon oxynitride film, another insulating film may be used to form the interlayer insulating film 1532. The film thickness is not limited to 100 nm, but may also be changed appropriately in consideration of a property such as a dielectric constant.

Then, hydrogenation is performed for terminating dangling bonds of the semiconductor films. In the present embodiment, heat treatment 410° C. for 1 hour performed in an atmosphere of 100% hydrogen to perform hydrogenation. Instead of hydrogenation by heat treatment, hydrogenation with plasma may be employed.

Next, an interlayer insulating film 1553 is formed on the interlayer insulating film 1532 (FIG. 4A). In the present embodiment, acrylic is applied for 1.0 μm thick to form the interlayer insulating film 1553. In addition to acrylic, an organic film that has self-flatness such as polyimide can be used.

Then, an interlayer insulating film 1554 is further formed on the interlayer insulating film 1533 (FIG. 4A). In the present embodiment, sputtering is used to form a silicon nitride film with a film thickness of 100 nm as the interlayer insulating film 1534. The interlayer insulating film 1534 functions as a barrier film for preventing an impurity from being mixed in the TFTs from a light-emitting element to be formed later.

Next, contact holes reaching the higher concentration impurity regions 1523a, 1523b, 1528a and 1528b are firmed by patterning and etching.

Then, wirings (or electrodes) 1535 for transmitting electrical signals to the TFTs 1550 to 1553 are formed (FIG. 4B). After forming the contact holes, titanium (Ti), aluminum containing silicon (Al—Si), titanium (Ti) are in order formed on the interlayer insulating film 1534 to have thicknesses of 100 nm, 350 nm, and 100 nm respectively, and processed into a desired shape by patterning and etching to form the wiring (or electrodes) 1535.

Next, a first transparent conductive film 1536 is formed to cover the wirings (or electrodes) 1535 (FIG. 4C). While a target including 5 wt % of silicon oxide ($SiO_2$), 85 wt % of indium oxide ($In_2O_3$), and 10 wt % of tin oxide ($SnO_2$) is used with argon (Ar) gas and oxygen ($O_2$) gas flowing respectively at 50 sccm and 3 sccm, ITO containing silicon oxide ($SiO_2$) or silicon (Si) is deposited by sputtering to have a film thickness of 90 nm as the first transparent conductive film 1536. When the transparent conductive film deposited under the foregoing conditions is analyzed with x-ray photoelectron spectroscopy (XPS/ESCA), the composition ratio (atomic %) of oxygen (O): silicon (Si) indium (In): tin (Sn) is 61:3:34:2.

Then, a second transparent conductive film 1537 is formed on the first transparent conductive film 1536. In the present embodiment, while a target including 90 wt % of indium oxide ($In_2O_3$) and 10 wt % of tin oxide ($SnO_2$) is used with argon (Ar) gas, oxygen ($O_2$), water ($H_2O$) flowing respectively at 50 sccm, 0.5 sccm, and 0.5 sccm, ITO is deposited by sputtering to have a film thickness of 20 nm as the second transparent conductive film 1537. When the transparent conductive film deposited under the foregoing conditions is analyzed with x-ray photoelectron spectroscopy (XPS/ESCA), the composition ratio (atomic %) of oxygen (O): indium (In): tin (Sn) is 62:36:2.

Then, by mechanical polishing the second transparent conductive film 1537 has a surface polished to remove convexo-concave due to a projection. In the present embodiment, since the structure that has the silicon nitride film (SiN) 1534 deposited by sputtering below the first transparent conductive film 1536 is unlikely to be peeled during the polishing. Suede abrasive cloth and slurry of an alumina abrasive grain that has a mean diameter of 0.4 μm (abrasive grain concentration: 4 wt %) are used to conduct the polishing under conditions of polishing pressure at 43 gf/cm$^2$, revolution of an upper plate at 30 rpm, and revolution of an lower plate at 20 rpm.

Then, with a resist mask used as a mask, a solution including oxalic acid (($COOH)_2$) that is a weak acid at a concentration of 5.0% or less is used at a solution temperature of 45° C. to etch the first transparent conductive film 1536 and the second transparent conductive film 1537 into a desired shape.

Then, heat treatment at 250° C. is performed to crystallize the second transparent conductive film. The first transparent conductive film 1536 is not crystallized by the heat treatment at 250° C. to remain to be amorphous.

Figure 8:
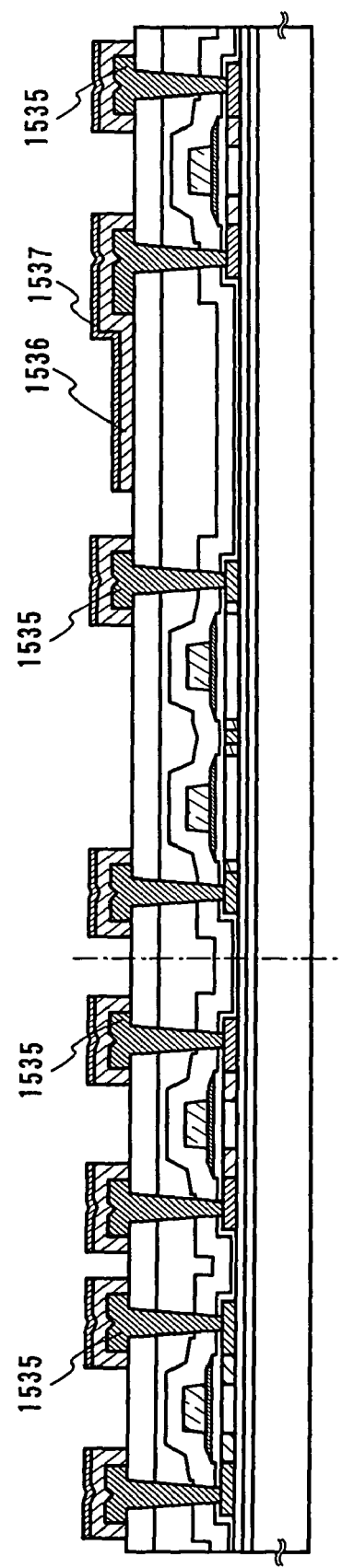
FIG. 8 is a diagram for describing a display device according to the present invention.

Here, the second transparent conductive film 1537 may be subjected to surface treatment with dilute hydrofluoric acid to remove an impurity that has adhered to the surface of the second transparent conductive film during the foregoing polishing process. Since the crystallized second transparent conductive film 1537 is more acid resistant, treatment with dilute hydrofluoric acid for a short time has no problem. However, in the case of performing treatment with dilute hydrofluoric acid, it is preferable to cover the wirings (or electrodes) 1535 and the first transparent conductive film 1536 with the second transparent conductive layer 1537 as a structure shown in FIG. 8.

Then, the surface of the crystallized second transparent conductive film 1537 is subjected to treatment in an atmosphere of oxygen plasma. In consequence, the second transparent conductive film 1537 has a higher work function enhanced to approximately 5.3 eV (approximately 4.8 eV before the oxygen plasma treatment).

In the present embodiment, the polishing treatment is conducted before processing the second transparent conductive 1537 into the desired shape. However, polishing treatment may be conducted after processing the second transparent conductive film 1537, or after further crystallization after processing the second transparent conductive film 1537.

Figure 5A:
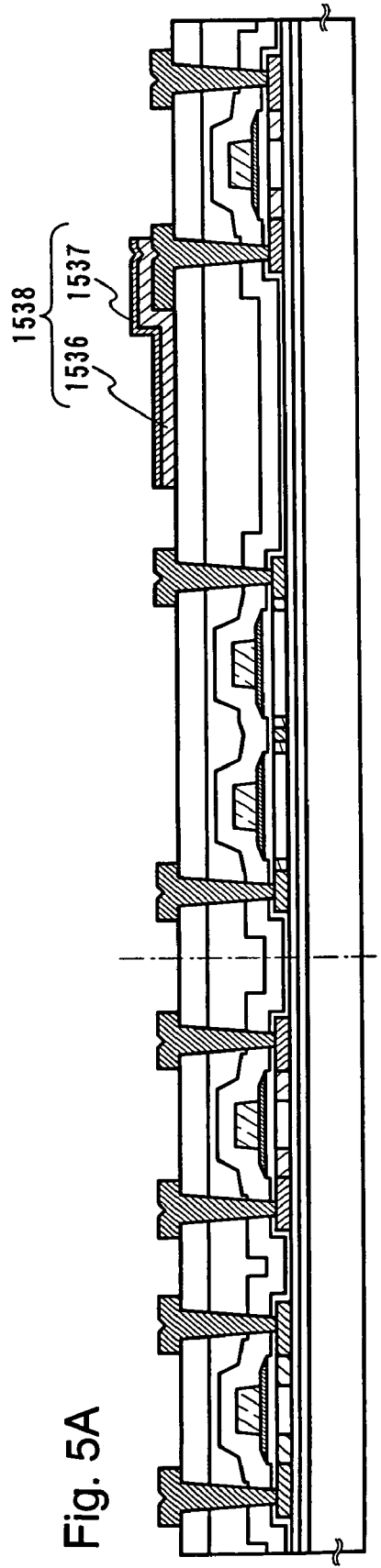
FIGS. 5A and 5B are diagrams for describing the method of manufacturing the display device according to the present invention.

In this way, an electrode 1538 of a light-emitting element, which includes the first transparent conductive film 1536 and the second transparent conductive film 1537, is formed (FIG. 5A). As described above, even in the case of using a weak acid solution such as oxalic acids etching can be performed without generating a residue of a transparent conductive film.

According to the processes described above, in the display device according to the present invention, a terminal portion of an FPC has a laminated structure in which a connecting wiring formed of the same layer as the wiring (or electrode) 1535, the first transparent conductive film and the second transparent conductive film. By employing the laminated structure, the connecting wiring formed of the same layer as the wiring (or electrodes) 1535 can be prevented from being exposed the air to be oxidized, and the display device has reliability improved.

Figure 5B:
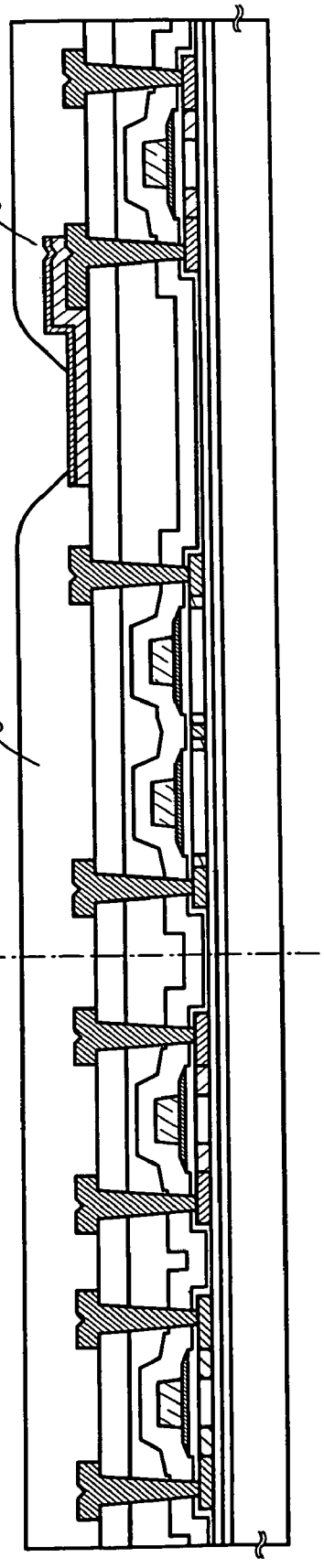

Next, an insulating film 1542 that has an opening is formed to expose a portion of the electrode 1538 of the light-emitting element (FIG. 5B). After photosensitive acrylic is applied to have a film thickness of 1.5 μm, the photosensitive acrylic is subjected to development and exposure to form the insulating film 1542 where an edge portion of the insulating film 1542 has a rounded shape. In addition to photosensitive acrylic, an insulating resin material non-photosensitive acrylic, polyimide (may be photosensitive or non-photosensitive), resist may be used. Further, an insulating inorganic material such as a silicon oxide film may be used.

Figure 6A:
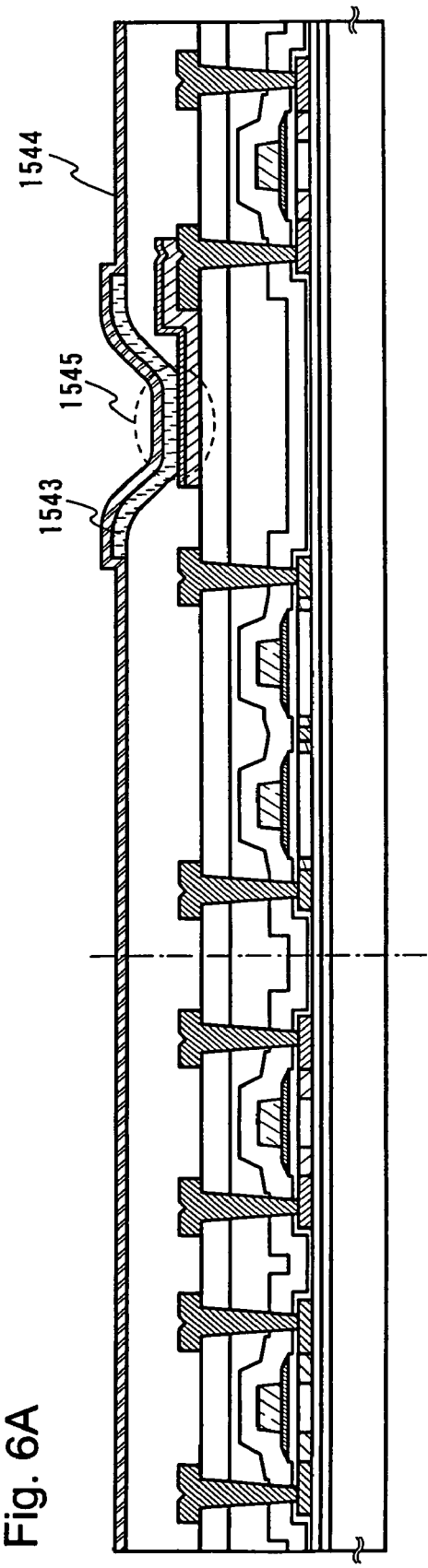
FIGS. 6A and 6B are diagrams for describing the method of manufacturing the display device according to the present invention.

Next, after performing pretreatment such as baking or irradiation of ultraviolet light, $Alq_3$ containing DMQd at 0.3% is deposited on the electrode 1538 of the light-emitting element to have a film thickness of 37.5 nm in order to form a light-emitting layer 1543 (FIG. 6A). Below the light-emitting layer 1543, CuPc is deposited to be 20 nm thick as a hole injection layer and α-NPD is deposited to be 40 nm thick as a hole transport layer. Above the light-emitting layer 1543, $Alq_3$ is deposited to have a film thickness of 37.5 nm as an electron transport layer.

In addition to the characteristics such as the materials and the thicknesses, which are mentioned above, another known material may be used to form the light-emitting layer film 1543. In order to obtain multicolor emissions, a plurality of light-emitting layers that are different in characteristic such as laminated structure or material may be formed. In addition to the organic materials mentioned above, an inorganic material may further be used to form the light-emitting layer.

Then, an electrode 1544 of the light-emitting element is formed (FIG. 6A). In order to form the electrode 1544 of the light-emitting element, calcium fluoride ($CaF_2$) and aluminum containing Li at a several percentage are laminated.

In this way, a light-emitting element 1545 that has the laminated structure of the electrode 1538 of the light-emitting element, the light-emitting layer 1543, and the electrode 1544 of the light-emitting element is formed (FIG. 6A). In the present embodiment, the electrode 1544 of the light-emitting element is formed of a film without translucency, and therefore the display device serves as a bottom emission display device that emits light from the lower side of the light-emitting element 1545 (the side where the TFTs are provided).

However, in addition to the bottom emission display device, the electrode 1544 of the light-emitting element may be formed of a film with translucency (for example, a laminate film that has a thin film containing an alkali metal or an alkali-earth metal and a transparent conductive film) to serve as a both emission display device that can also emit light from the upper side of the light-emitting element 1545. Alternatively, the electrode 1538 of the light-emitting element may be formed of a laminate film that has aluminum (Al) for using as a reflective film, the first transparent conductive film, and the second transparent conductive film to serve as a top emission display device that emits light from the upper side of the light-emitting element 1545.

Figure 6B:
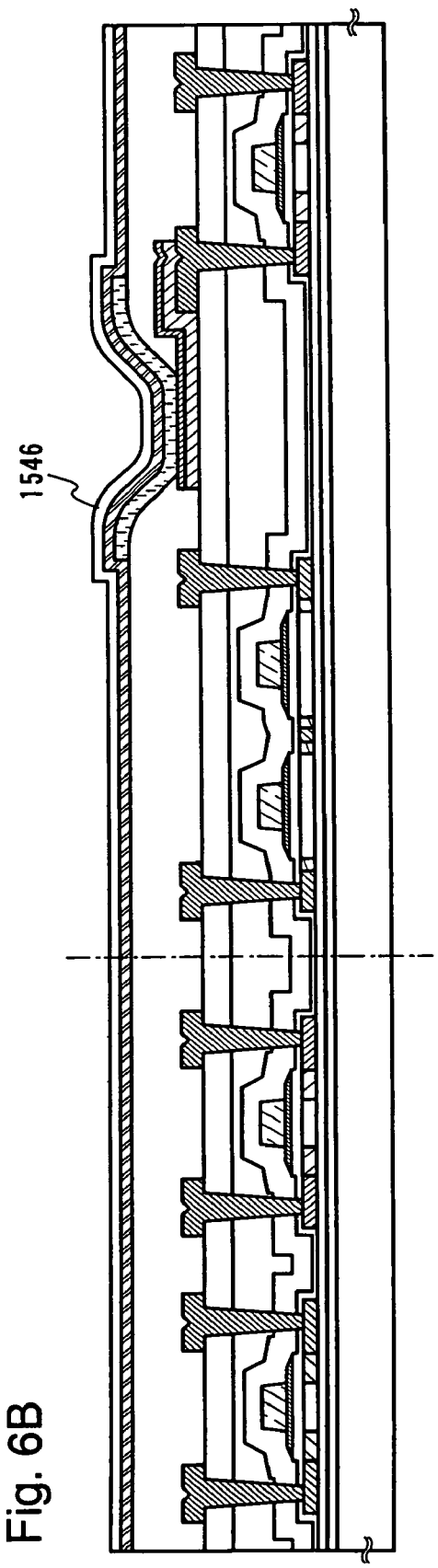

Next, a protective film 1546 for protecting the light-emitting element 1545 is formed (FIG. 6B). In the present embodiment, a silicon nitride film is formed by sputtering to form the protective film 1546. In addition to the silicon nitride film, another material such as DLC (Diamond like Carbon) may be used to form the protective film 1546.

Additionally, a sealing substrate and an FPC are placed to manufacture the display device to which the present invention is applied. In order to prevent degradation of the light-emitting element due to moisture mixed in, the sealing substrate may have a desiccant placed.

Figure 7A:
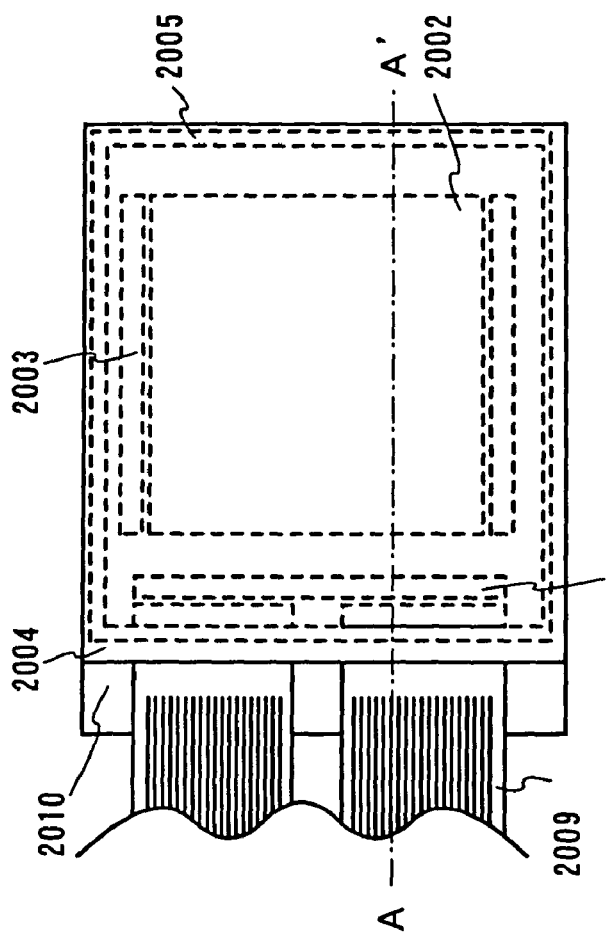
FIGS. 7A and 7B are diagrams for describing a display device according to the present invention.
Figure 7B:
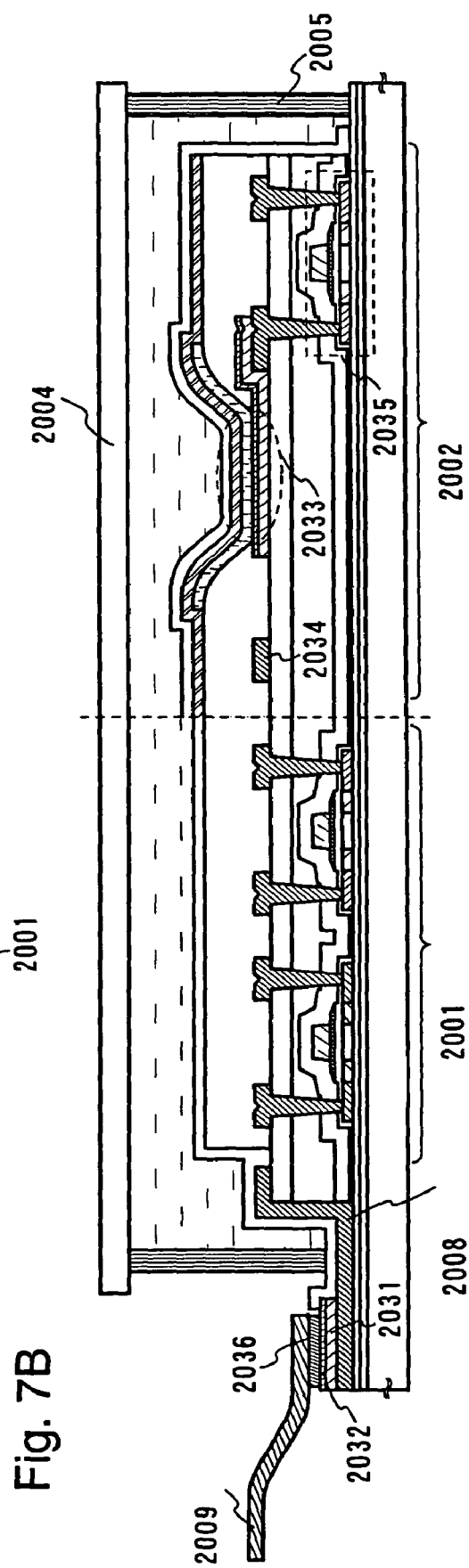

FIG. 7A shows a top view of a display device according to the present invention and FIG. 7B shows a sectional view along of A-A' of FIG. 7B (Since the display device has a plurality of TFTs 2035 for respectively driving light-emitting elements, which have the same structure, only one of the plurality of TFTs 2035 is shown in the sectional view. The omission is applied in the same way in the case of light-emitting device 2033.). A reference number 2001 shown by a dashed line indicates a source signal line driver circuit and reference numbers 2002 and 2003 respectively indicate a pixel portion and gate signal line driver circuit. Additionally, reference numbers 2004 and 2005 respectively indicate a sealing substrate and a sealing agent, and the inside surrounded by the sealing substrate 2004 and the sealing agent 2005 is a space. Reference numbers 2010 and 2034 respectively indicate a substrate and a wiring.

A reference number 2008 shows a connecting wiring for transmitting input signals to the source signal line driver circuit 2001 and the gate signal line driver circuit 2003, which receives a video signal and a clock signal from an FPC (Flexible Printed Circuit) 2009 that serves as an external input terminal. Although only the FPC is shown in the figures here, a printed wiring board (PWB) may be attached to the FPC 2009. The connecting wiring 2008 and the FPC 2009 are bonded with a conductive sealing agent 2036.

Embodiment 2

In the present embodiment, a display device that has a different structure from Embodiment 1 will be described with reference to FIG. 9.

Figure 9:
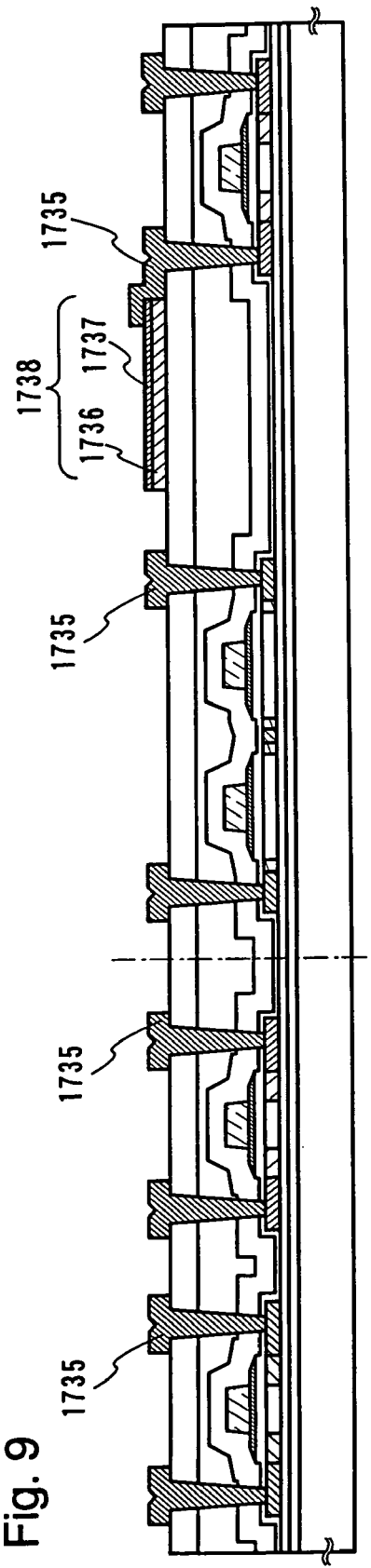
FIG. 9 is a diagram for describing a display device according to the present invention.

In FIG. 9, wirings (or electrodes) 1735 for transmitting electrical signals to respective TFTs are formed above an electrode 1738 of a light-emitting element, which is formed to have a first transparent conductive film 1736 and a second transparent conductive film 1737. In the case of the display device that has the foregoing structure, the wirings (or electrodes) 1735 are formed after forming the electrode 1738 of the light-emitting element. In FIG. 9, layers to be formed above the electrode 1738 of the light-emitting element such as an insulating film and a light-emitting layer are not shown.

Therefore, a solution such as a strong acid solution of iron chloride can be also used to process the first transparent conductive film 1736 and the second transparent conductive film 1737. However, in consideration of easiness of using a solution and contamination due to a metal element included in a solution, it is preferable to use a weak acid solution for etching.

Accordingly, also in the case of the display device that has the foregoing structure, it is effective to use a weak acid solution for etching according to the present invention.

Besides, also in the present embodiment, a polishing process can be made easier by providing a silicon nitride film formed by sputtering below the electrode 1738 of the light-emitting element.

Embodiment 3

In the present embodiment, a display device that has a different structure from Embodiments 1 and Embodiment 2 will be described with reference to FIG. 10.

Figure 10:
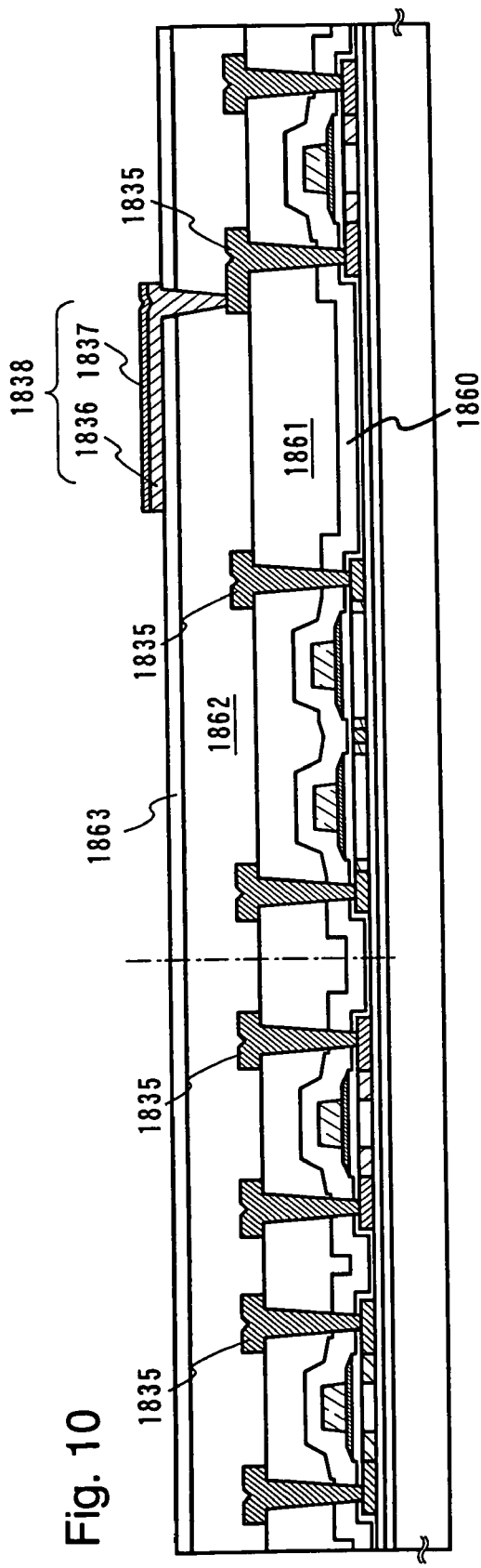
FIG. 10 is diagram for describing a display device according to the present invention.

In FIG. 10, wirings (or electrodes) 1835 for transmitting electrical signals to respective TFTs are provided on a first interlayer insulating film (1860 and 1861), a second interlayer insulating film (1862 and 1863) is provided on the wirings (or electrodes) 1835, and an electrode 1838 of a light-emitting element is provided on the second interlayer insulating film (1862 and 1863). The electrode 1838 of the light-emitting element includes a first transparent conductive film 1836 and a second transparent conductive film 1837. The second interlayer insulating film (1862 and 1863) has a two-layer structure of an organic resin film 1862 such as acrylic or polyimide and a Silicon nitride film 1863 formed thereon by sputtering. In FIG. 10, layers to be formed above the electrode 1838 of the light-emitting element such as an insulating film and a light-emitting layer are not shown.

Also in the present embodiment, like Embodiment 2, a solution such as a strong acid solution of iron chloride can be also used to process the first transparent conductive film 1836 and the second transparent conductive film 1837. However, in consideration of easiness of using a solution and contamination due to a metal element included in a solution, it is preferable to use a weak acid solution for etching.

Accordingly, also in the case of the display device that has the foregoing structure, it is effective to use a weak acid solution for etching according to the present invention.

Besides, also in the present embodiment, a polishing process can be made easier by providing a silicon nitride film formed by sputtering below the electrode 1838 of the light-emitting element.

Embodiment 4

In the present embodiment, electronic devices to which the present invention is applied will be described. By applying the present invention, it is impossible to provide an electronic device that has a display device that displays favorable images.

Figure 11A:
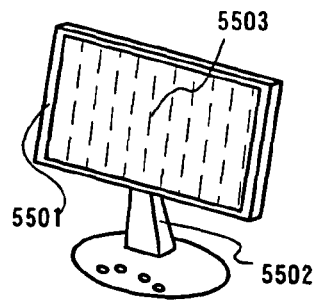
FIGS. 11A to 11F are diagrams for describing electronic devices to which a display device according to the present invention is applied.

FIG. 11A shows a display device, which includes a frame body 5501, a support 5502, and a display portion 5503. The present invention can be applied to a display device that has the display portion 5503.

Figure 11B:
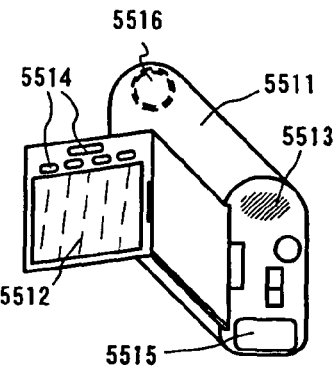

FIG. 11B shows a video camera, which includes a main body 5511, a display portion 5512, a voice input portion 5513, operation switches 5514, a battery 5515, an image receiving portion 5516. The present invention can be applied to a display device that has the display portion 5512.

Figure 11C:
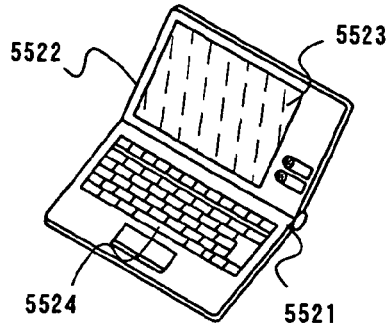

FIG. 11C shows a laptop personal computer manufactured according to the present invention, which includes a main body 5521, a frame body 5522, a display portion 5523, and a keyboard 5524. The present invention can be applied to a display device that has the display portion 5523.

Figure 11D:
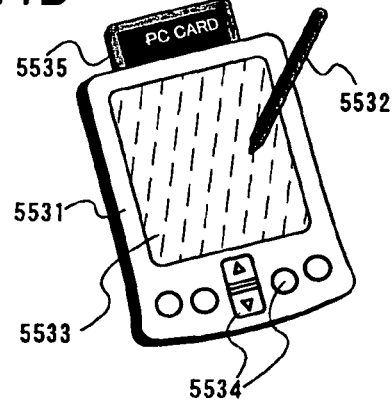
Figure 11E:
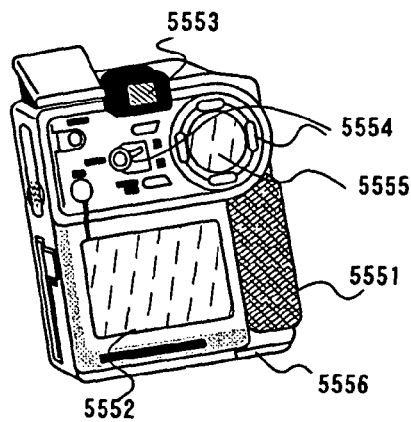

FIG. 11D show a personal digital assistant (PDA) manufactured according to the present invention, which includes a main body 5531 that has a display portion 5533, an external interface 5535, and operation buttons 5534 provided. As an attachment for operations, a stylus 5532 is provided. The present invention can be applied to a display device that has the display portion 5532.

FIG. 11D shows a digital camera, which includes a main body 5551, a display portion (A) 5552, an eye piece 5553, operation switches 5554, a display portion (B) 5555, and a battery 5556. The present invention can be applied to the display portions (A) and (B) 5552 and 5555.

Figure 11F:
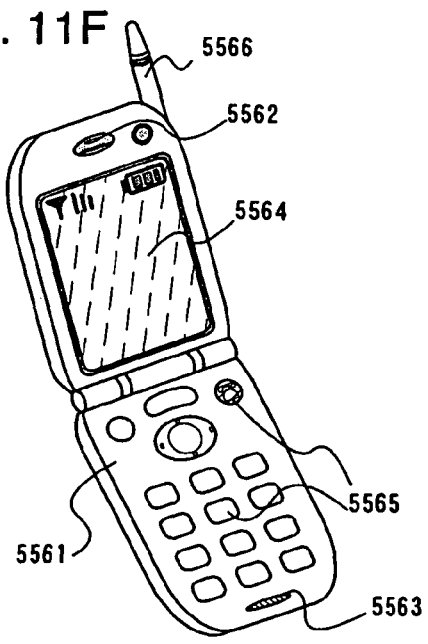

FIG. 11F shows a mobile phone manufactured according to the present invention, which includes a main body 5561 that has a display portion 5564, a voice output portion 5562, a voice input portion 5563, operation switches 5565, and an antenna 5566. The present invention can be applied to a display device that has the display portion 5564.

According to the present invention, an electrode of a light-emitting element can be formed without a residue of a transparent conductive film even in the case of using a weak acid solution for etching. Accordingly, a conductive film such as a wiring can be prevented from reacting with an etching solution during etching a transparent conductive film, and a display device without a failure in display such as a line defect can be manufactured.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method of manufacturing a display device, comprising:
    forming a first transparent conductive film comprising one selected from the group consisting of indium tin oxide containing one or both of silicon oxide and silicon, zinc oxide and zinc oxide containing gallium;
    forming a second transparent conductive film comprising one selected from the group consisting of indium tin oxide and tin oxide over the first transparent conductive film so as to have a laminate structure of the first transparent conductive film and the second transparent conductive film; and
    patterning the first transparent conductive film and the second transparent conductive film by using a weak acid solution after forming the second transparent conductive film over the first transparent conductive film.

2. The method according to claim 1, wherein the second transparent conductive film has a surface polished between the step of forming the second transparent conductive film and the step of patterning the first transparent conductive film and the second transparent conductive film.

3. The method according to claim 1, wherein the first transparent conductive film is an amorphous transparent conductive film.

4. The method according to claim 1, further comprising forming a light-emitting layer over the second transparent conductive film; and
    forming a film without translucency over the light-emitting layer.

5. The method according to claim 1, wherein the second transparent conductive film has a work function of 5.0 eV or more.

6. The method according to claim 1, wherein the first transparent conductive film has a film thickness of 80 to 120 nm, and the second transparent conductive film has a film thickness of 5 to 30 nm.

7. The method according to claim 1, wherein the display device is applied in an electronic device selected from the group consisting of a video camera, a laptop personal computer, a personal digital assistant, a digital camera and a mobile phone.

8. A method of manufacturing a display device, comprising:
    forming a first transparent conductive film comprising one selected from the group consisting of indium tin oxide containing one or both of silicon oxide and silicon, zinc oxide and zinc oxide containing gallium;
    forming a second transparent conductive film comprising one selected from the group consisting of indium tin oxide and tin oxide over the first transparent conductive film so as to have a laminate structure of the first transparent conductive film and the second transparent conductive film;
    patterning the first transparent conductive film and the second transparent conductive film by using a weak acid solution after forming the second transparent conductive film over the first transparent conductive film; and
    performing heat treatment to crystallize the second transparent conductive film after patterning the first transparent conductive film and the second transparent conductive film.

9. The method according to claim 8, wherein the second transparent conductive film has a surface polished between the step of forming the second transparent conductive film and the step of patterning the first transparent conductive film and the second transparent conductive film.

10. The method according to claim 8, wherein a strong acid solution is used to subject the second transparent conductive film to surface treatment after crystallizing the second transparent conductive film.

11. The method according to claim 8, wherein the first transparent conductive film is an amorphous transparent conductive film.

12. The method according to claim 8, further comprising forming a light-emitting layer over the second transparent conductive film; and
    forming a film without translucency over the light-emitting layer.

13. The method according to claim 8, wherein the second transparent conductive film has a work function of 5.0 eV or more.

14. The method according to claim 8, wherein the first transparent conductive film has a film thickness of 80 to 120 nm, and the second transparent conductive film has a film thickness of 5 to 30 nm.

15. The method according to claim 8, wherein the display device is applied in an electronic device selected from the group consisting of a video camera, a laptop personal computer, a personal digital assistant, a digital camera and a mobile phone.

16. A method of manufacturing a display device, comprising:
forming a first transparent conductive film comprising one selected from the group consisting of indium tin oxide containing one or both of silicon oxide and silicon, zinc oxide and zinc oxide containing gallium;
forming a second transparent conductive film comprising one selected from the group consisting of indium tin oxide and tin oxide over the first transparent conductive film so as to have a laminate structure of the first transparent conductive film and the second transparent conductive film;
patterning the first transparent conductive film and the second transparent conductive film by using a weak acid solution after forming the second transparent conductive film over the first transparent conductive film;
performing heat treatment to crystallize the second transparent conductive film after patterning the first transparent conductive film and the second transparent conductive film; and
subjecting the second transparent conductive film to surface treatment after performing the heat treatment.

17. The method according to claim 16, wherein the second transparent conductive film has a surface polished between the step of forming the second transparent conductive film and the step of patterning the first transparent conductive film and the second transparent conductive film.

18. The method according to claim 16, wherein a strong acid solution is used to subject the second transparent conductive film to surface treatment after crystallizing the second transparent conductive film.

19. The method according to claim 16, wherein oxygen plasma or alkali solution is used for the surface treatment.

20. The method according to claim 16, wherein the first transparent conductive film is an amorphous transparent conductive film.

21. The method according to claim 16, further comprising forming a light-emitting layer over the second transparent conductive film.

22. The method according to claim 16, wherein the second transparent conductive film has a work function of 5.0 eV or more.

23. The method according to claim 16, wherein the first transparent conductive film has a film thickness of 80 to 120 nm, and the second transparent conductive film has a film thickness of 5 to 30 nm.

24. The method according to claim 16, wherein the display device is applied in an electronic device selected from the group consisting of a video camera, a laptop personal computer, a personal digital assistant, a digital camera and a mobile phone.

25. A method of manufacturing a display device, comprising:
forming a first transparent conductive film;
forming a second transparent conductive film over the first transparent conductive film so as to have a laminate structure of the first transparent conductive film and the second transparent conductive film; and
patterning the first transparent conductive film and the second transparent conductive film by using a weak acid solution after forming the second transparent conductive film over the first transparent conductive film,
wherein crystallinity of the second transparent conductive film is higher than that of the first transparent conductive film.

26. The method according to claim 25, further comprising a step of polishing a surface of the second transparent conductive film.

27. The method according to claim 25, wherein the first transparent conductive film is an amorphous transparent conductive film.

28. The method according to claim 25, further comprising forming a light-emitting layer over the second transparent conductive film; and
forming a film without translucency over the light-emitting layer.

29. The method according to claim 25, wherein the second transparent conductive film has a work function of 5.0 eV or more.

30. The method according to claim 25, wherein the first transparent conductive film has a film thickness of 80 to 120 nm, and the second transparent conductive film has a film thickness of 5 to 30 nm.

31. The method according to claim 25, wherein the display device is applied in an electronic device selected from the group consisting of a video camera, a laptop personal computer, a personal digital assistant, a digital camera and a mobile phone.

32. A method of manufacturing a display device, comprising:
forming a first transparent conductive film;
forming a second transparent conductive film over the first transparent conductive film so as to have a laminate structure of the first transparent conductive film and the second transparent conductive film;
patterning the first transparent conductive film and the second transparent conductive film by using a weak acid solution after forming the second transparent conductive film over the first transparent conductive film; and
performing heat treatment to crystallize the second transparent conductive film after forming the second transparent conductive film over the first transparent conductive film,
wherein crystallinity of the second transparent conductive film is higher than that of the first transparent conductive film.

33. The method according to claim 32, further comprising a step of polishing a surface of the second transparent conductive film.

34. The method according to claim 32, wherein a strong acid solution is used to subject the second transparent conductive film to surface treatment after crystallizing the second transparent conductive film.

35. The method according to claim 32, wherein the first transparent conductive film is an amorphous transparent conductive film.

36. The method according to claim 32, further comprising forming a light-emitting layer over the second transparent conductive film; and
forming a film without translucency over the light-emitting layer.

37. The method according to claim 32, wherein the second transparent conductive film has a work function of 5.0 eV or more.

38. The method according to claim 32, wherein the first transparent conductive film has a film thickness of 80 to 120 nm, and the second transparent conductive film has a film thickness of 5 to 30 nm.

39. The method according to claim 32, wherein the display device is applied in an electronic device selected from the group consisting of a video camera, a laptop personal computer, a personal digital assistant, a digital camera and a mobile phone.

40. A method of manufacturing a display device, comprising:

forming a first transparent conductive film;

forming a second transparent conductive film over the first transparent conductive film so as to have a laminate structure of the first transparent conductive film and the second transparent conductive film;

performing heat treatment to crystallize the second transparent conductive film after forming the second transparent conductive film over the first transparent conductive film; and subjecting the second transparent conductive film to surface treatment after performing the heat treatment, wherein crystallinity of the second transparent conductive film is higher than that of the first transparent conductive film.

41. The method according to claim 40, further comprising a step of polishing a surface of the second transparent conductive film.

42. The method according to claim 40, wherein a strong acid solution is used to subject the second transparent conductive film to surface treatment after crystallizing the second transparent conductive film.

43. The method according to claim 40, wherein oxygen plasma or alkali solution is used for the surface treatment.

44. The method according to claim 40, wherein the first transparent conductive film is an amorphous transparent conductive film.

45. The method according to claim 40, further comprising forming a light-emitting layer over the second transparent conductive film.

46. The method according to claim 40, wherein the second transparent conductive film has a work function of 5.0 eV or more.

47. The method according to claim 40, wherein the first transparent conductive film has a film thickness of 80 to 120 nm, and the second transparent conductive film has a film thickness of 5 to 30 nm.

48. The method according to claim 40, wherein the display device is applied in an electronic device selected from the group consisting of a video camera, a laptop personal computer, a personal digital assistant, a digital camera and a mobile phone.

* * * * *

UNITED STATES PATENT AND TRADEMARK OFFICE
CERTIFICATE OF CORRECTION

PATENT NO.         : 8,054,397 B2
APPLICATION NO.    : 11/436131
DATED              : November 8, 2011
INVENTOR(S)        : Kengo Akimoto et al.

Page 1 of 1

It is certified that error appears in the above-identified patent and that said Letters Patent is hereby corrected as shown below:

In the Specification:

Col. 10, line 21, "oxalic acids etching" should read "oxalic acid, etching"

Col. 12, line 38, "a Silicon nitride film 1863" should read "a silicon nitride film 1863"

Col. 12, line 61, "it is impossible to provide" should read "it is possible to provide"

Signed and Sealed this
Twenty-eighth Day of August, 2012

David J. Kappos
*Director of the United States Patent and Trademark Office*